(12) United States Patent
Ding et al.

(10) Patent No.: US 6,610,184 B2
(45) Date of Patent: Aug. 26, 2003

(54) MAGNET ARRAY IN CONJUNCTION WITH ROTATING MAGNETRON FOR PLASMA SPUTTERING

(75) Inventors: Peijun Ding, San Jose, CA (US); Rong Tao, San Jose, CA (US); Zheng Xu, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/993,543

(22) Filed: Nov. 14, 2001

(65) Prior Publication Data

US 2003/0089601 A1 May 15, 2003

(51) Int. Cl.⁷ .............................................. C23C 14/35
(52) U.S. Cl. .......................... 204/298.17; 204/298.16; 204/298.2; 204/298.22
(58) Field of Search ...................... 204/298.16, 298.17, 204/298.2, 298.22

(56) References Cited

U.S. PATENT DOCUMENTS

| | | | |
|---|---|---|---|
| 4,871,433 A | 10/1989 | Wagner et al. | 204/192.12 |
| 5,133,825 A | 7/1992 | Hakamata et al. | 156/345 |
| 5,178,739 A | 1/1993 | Barnes et al. | 204/192.12 |
| 5,482,611 A | 1/1996 | Helmer et al. | 204/298.17 |
| 5,593,551 A | 1/1997 | Lai | 204/192.12 |
| 5,733,405 A | 3/1998 | Taki et al. | 156/345 |
| 5,907,220 A * | 5/1999 | Tepman et al. | 315/111.41 |
| 6,014,943 A | 1/2000 | Arami et al. | 118/723 E |
| 6,077,403 A * | 6/2000 | Kobayashi et al. | 204/192.12 |
| 6,159,351 A | 12/2000 | J'Afer et al. | 204/298.19 |
| 6,163,006 A | 12/2000 | Doughty et al. | 219/121.43 |
| 6,179,973 B1 | 1/2001 | Lai et al. | 204/192.12 |
| 6,193,854 B1 | 2/2001 | Lai et al. | 204/192.12 |
| 6,290,825 B1 | 9/2001 | Fu | 204/298 |
| 6,413,383 B1 * | 7/2002 | Chiang et al. | 204/192.13 |
| 6,423,192 B1 | 7/2002 | Wada et al. | 204/192.12 |

FOREIGN PATENT DOCUMENTS

| | | | |
|---|---|---|---|
| EP | 0 653 776 | 5/1995 | H01J/37/34 |
| EP | 1 091 016 | 4/2001 | C23C/14/35 |
| EP | 1 119 017 | 7/2001 | H01J/37/34 |
| EP | 1 174 902 | 1/2002 | H01J/37/34 |
| WO | WO 00/05745 | 2/2000 | H01J/37/34 |
| WO | WO 02/11176 | 2/2002 | H01J/37/34 |
| WO | WO 02/37528 | 5/2002 | H01J/37/34 |

OTHER PUBLICATIONS

Ashtiani et al., "A new hollow–cathode magnetron source for 0.10 μm copper applications", 0–7803–6327–2,2000, pp. 37–39.
Japan 10204614 English Abstract.

* cited by examiner

*Primary Examiner*—Steven H. VerSteeg
(74) *Attorney, Agent, or Firm*—Charles S. Guenzer

(57) ABSTRACT

An array of auxiliary magnets is disclosed that is positioned along sidewalls of a magnetron sputter reactor on a side towards the wafer from the target. The magnetron preferably is a small, strong one having a stronger outer pole of a first magnetic polarity surrounding a weaker outer pole of a second magnetic polarity and rotates about the central axis of the chamber. The auxiliary magnets preferably have the first magnetic polarity to draw the unbalanced magnetic field component toward the wafer. The auxiliary magnets may be either permanent magnets or electromagnets.

15 Claims, 3 Drawing Sheets

MAGNET ARRAY IN CONJUNCTION WITH ROTATING MAGNETRON FOR PLASMA SPUTTERING

BACKGROUND OF THE INVENTION

1. Field of the Invention

The invention relates generally to sputtering of materials. In particular, the invention relates to the magnetron creating a magnetic field to enhance sputtering.

2. Background Art

Magnetos sputtering is a principal method of depositing metal onto a semiconductor integrated circuit during its fabrication in order to form electrical connections and other structures in the integrated circuit. A target is composed of the metal to be deposited, and ions in a plasma are attracted to the target at sufficient energy that target atoms are dislodged from the target, that is, sputtered. The sputtered atoms travel generally ballistically toward the wafer being sputter coated, and the metal atoms are deposited on the wafer in metallic form. Alternatively, the metal atoms react with another gas in the plasma, for example, nitrogen, to reactively deposit a metal compound on the wafer. Reactive sputtering is often used to form thin barrier and nucleation layers of titanium nitride or tantalum nitride on the sides of narrow holes.

DC magnetron sputtering is the most usually practiced commercial form of sputtering. The metallic target is biased to a negative DC bias in the range of about −400 to −600DC to attract positive ions of the argon working gas toward the target to sputter the metal atoms. Usually, the sides of the sputter reactor are covered with a shield to protect the chamber walls from sputter deposition. The shield is typically electrically grounded and thus provides an anode in opposition to the target cathode to capacitively couple the DC target power into the chamber and its plasma.

A magnetron having at least a pair of opposed magnetic poles is disposed in back of the target to generate a magnetic field close to and parallel to the front face of the target. The magnetic field traps electrons, and, for charge neutrality in the plasma, additional argon ions are attracted into the region adjacent to the magnetron to form there a high-density plasma. Thereby, the sputtering rate is increased.

However, conventional sputtering presents challenges in the formation of advanced integrated circuits. As mentioned above, sputtering is fundamentally a ballistic process having an approximate isotropic sputtering pattern that is well suited for coating planar surfaces but ill suited for depositing metal into the narrow features characteristic of advanced integrated circuits. For example, advanced integrated circuits include many inter-level vias having aspect ratios of 5:1 and higher, which need to be coated and filled with metal. However, techniques have been developed for drawing the sputtered atoms deep within the narrow, deep holes to coat the bottom and sides and then to fill the hole with metal without bridging the hole and thereby forming an included void.

A general technique for sputtering into deep holes ionizes the sputtered atoms and additionally negatively biases the wafer to cause the positively charged sputtered metal atoms to accelerate toward the wafer. Thereby, the sputtering pattern becomes an isotropic and directed toward the bottom of the holes. A negative self-bias naturally develops on an electrically floating pedestal. However, for more control, a voltage may be impressed on the pedestal. Typically, an RF power supply is coupled to a pedestal electrode through a coupling capacitor, and a negative DC self-bias voltage develops on the pedestal adjacent to the plasma.

At least two techniques are available which increase the plasma density in the sputtering chamber and thereby increase the fraction of ionized sputtered atoms.

One method, called ionized metal plating (IMP) uses an RF inductive coil wrapped around the processing space between the target and the wafer to couple RF energy in the megahertz frequency range into the processing space. The coil generates an axial RF magnetic field in the plasma which in turn generates a circumferential electric field at the edges of the plasma, thereby coupling energy into the plasma in a region remote from the wafer and increasing its density and thereby increasing the metal ionization rate. IMP sputtering is typically performed at a relatively high argon pressure of 50 to 100 milliTorr.

IMP is very effective at deep hole filing. Its ionization fraction can be well above 50%. However, IMP equipment is relatively expensive. Even more importantly, IMP tends to be a hot, energetic, high-pressure process in which a large number of argon ions are also accelerated toward the wafer. Film quality resulting from IMP is not optimal for all applications.

A recently developed technology of self-ionized plasma (SIP) sputtering allows plasma sputtering reactors to be only slightly modified but to nonetheless achieve efficient filling of metals into high aspect-ratio holes in a low-pressure, low-temperature process. This technology has been described by Fu et al. In U.S. Pat. No. 6,290,825 and by Chianti et al. In U.S. patent application Ser. No. 09/414,614, filed Oct. 8, 1999 and now issued as U.S. Pat. No. 6,398,929, both incorporated herein by reference in their entireties.

SIP sputtering uses a variety of modifications to a fairly conventional capacitively coupled magnetron sputter reactor to generate a high-density plasma (HAP) adjacent to the target and to extend the plasma and guide the metal ions toward the wafer. Relatively high amounts of DC power are applied to the target, for example, 20 to 40 KW for a chamber designed for 200 mm wafers. Furthermore, the magnetron has a relatively small area so that the target power is concentrated in the smaller area of the magnetron, thus increasing the power density supplied to the HDP region adjacent the magnetron. The small-area magnetron is disposed to a side of a center of the target and is rotated about the center to provide more uniform sputtering and deposition.

In one type of SIP sputtering, the magnetron has unbalanced poles, usually a strong outer pole of one magnetic polarity surrounding a weaker inner pole of the other polarity. The magnetic field lines emanating from the stronger pole may be decomposed into not only a conventional horizontal magnetic field adjacent the target face but also a vertical magnetic field extending toward the wafer. The vertical field lines extend the plasma closer toward the wafer and also guide the metal ions toward the wafer. Furthermore, the vertical magnetic lines close to the chamber walls act to block the diffusion of electrons from the plasma to the grounded shields. The reduced electron loss is particularly effective at increasing the plasma density and extending the plasma across the processing space.

SIP sputtering may be accomplished without the use of RF inductive coils. The small HDP region is sufficient to ionize a substantial fraction of metal ions, estimated to be between 10 and 25%, which effectively sputter coats into deep holes. Particularly at the high ionization fraction, the ionized sputtered metal atoms are attracted back to the targets and sputter yet further metal atoms. As a result, the argon working pressure may be reduced without the plasma collapsing. Therefore, argon heating of the wafer is less of a problem, and there is reduced likelihood of the metal ions colliding with argon atoms, which would both reduce the ion density and randomize the metal ion sputtering pattern.

A further advantage of the unbalanced magnetron used in SIP sputtering is that the magnetic field from the stronger, outer annular pole projects far into the plasma processing area towards the wafer. This projecting field has the advantage of supporting a strong plasma over a larger extent of the plasma processing area and to guide ionized sputter particles towards the wafer. Weir Wing in U.S. patent application Ser. No. 09/612,861, filed Jul. 10, 2000 and now issued as U.S. Pat. No. 6,352,629, discloses the use of a coaxial electromagnetic coil wrapped around the major portion of the plasma process region to create a magnetic field component extending from the target to the wafer. The magnetic coil is particularly effective in combining SIP sputtering in a long-throw sputter reactor, that is, one having a larger spacing between the target and the wafer because the auxiliary magnetic field supports the plasma and further guides the ionized sputter particles. Lai discloses in U.S. Pat. No. 5,593,551 a smaller coil in near the target.

However, SIP sputtering could still be improved. One of its fundamental problems is the limited number of variables available in optimizing the magnetic field configuration. The magnetron should be small in order to maximize the target power density, but the target needs to be uniformly sputtered. The magnetic field should have a strong horizontal component adjacent the target to maximize the electron trapping there. Some component of the magnetic field should project from the target towards the wafer to guide the ionized sputter particles. The coaxial magnetic coil of Wang addresses only some of these problems. The horizontally arranged permanent magnets disclosed by Lai in U.S. Pat. No. 5,593,551 poorly address this effect.

SUMMARY OF THE INVENTION

The invention includes an auxiliary magnet array in a magnetron sputter reactor disposed around the chamber close to the wafer and having a first vertical magnetic polarity. The magnets may either be permanent magnets or an array of electromagnets having coil axes along the central axis of the chamber.

In one embodiment, a rotatable magnetron having a strong outer pole of the first magnetic polarity surrounds a weaker pole of the opposite polarity. The auxiliary magnets are preferably located in the half of the processing space near the wafer to pull the unbalanced portion of the magnetic field from the outer pole towards the wafer.

DETAILED DESCRIPTION OF THE PREFERRED EMBODIMENTS

Figure 1:
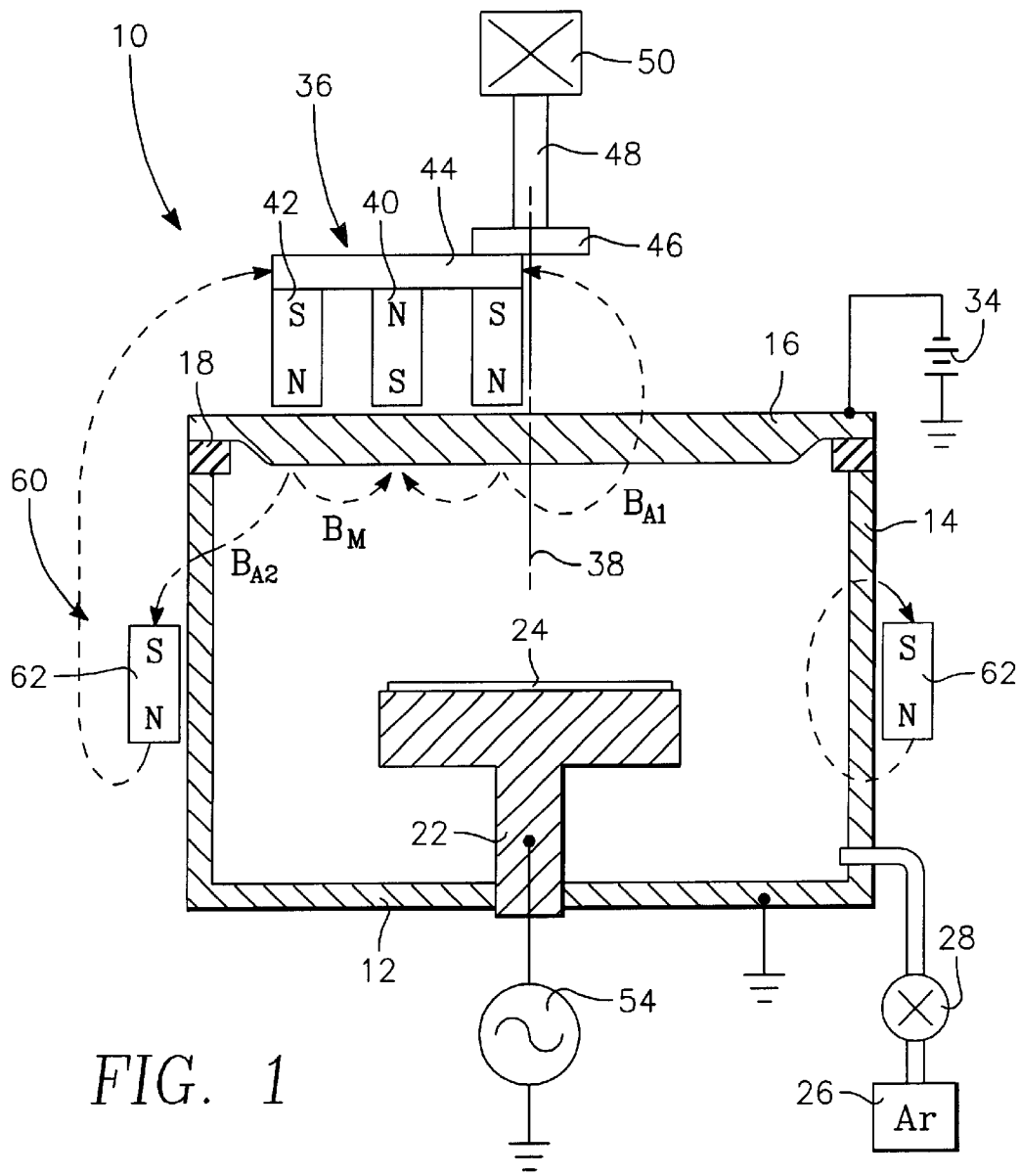
FIG. 1 is a schematic cross-sectional view of a sputter reactor including an auxiliary magnet array of the invention.

A first embodiment of a plasma sputtering reactor 10 of the invention is illustrated in the schematic cross-section view of FIG. 1. A vacuum chamber 12 includes generally cylindrical sidewalls 14, which are electrically grounded. Typically, unillustrated grounded replaceable shields are located inside the sidewalls 14 to protect them from being sputter coated, but they act as chamber sidewalls except for holding a vacuum. A sputtering target 16 composed of the metal to be sputtered is sealed to the chamber 12 through an electrical isolator 18. A pedestal electrode 22 supports a wafer 24 to be sputter coated in parallel opposition to the target 16. A processing space is defined between the target 16 and the wafer 24 inside of the shields.

A sputtering working gas, preferably argon, is metered into the chamber from a gas supply 26 through a mass flow controller 28. An unillustrated vacuum pumping system maintains the interior of the chamber 12 at a very low base pressure of typically $10^{-8}$ Torr or less. During plasma ignition, the argon pressure is supplied in an amount producing a chamber pressure of approximately 5 milliTorr, but as will be explained later the pressure is thereafter decreased. A DC power supply 34 negatively biases the target 16 to approximately –600DC causing the argon working gas to be excited into a plasma containing electrons and positive argon ions. The positive argon ions are attracted to the negatively biased target 16 and sputter metal atoms from the target.

The invention is particularly useful with SIP sputtering in which a small nested magnetron 36 is supported on an unillustrated back plate behind the target 16. The chamber 12 and target 16 are generally circularly symmetric about a central axis 38. The SIP magnetron 36 includes an inner magnet pole 40 of a first vertical magnetic polarity and a surrounding outer magnet pole 42 of the opposed second vertical magnetic polarity. Both poles are supported by and magnetically coupled through a magnetic yoke 44. The yoke 44 is fixed to a rotation arm 46 supported on a rotation shaft 48 extending along the central axis 38. A motor 50 connected to the shaft 48 causes the magnetron 36 to rotate about the central axis 38.

In an unbalanced magnetron, the outer pole 42 has a total magnetic flux integrated over its area that is larger than that produced by the inner pole 40, preferably having a ratio of the magnetic intensities of at least 150%. The opposed magnetic poles 40, 42 create a magnetic field inside the chamber 12 that is generally semi-toroidal with strong components parallel and close to the face of the target 16 to create a high-density plasma there to thereby increase the sputtering rate and increase the ionization fraction of the sputtered metal atoms. Because the outer pole 42 is magnetically stronger than the inner pole 40, a fraction of the magnetic field from the outer pole 42 projects far towards the pedestal 22 before it loops back to behind the outer pole 42 to complete the magnetic circuit.

An RF power supply 54, for example, having a frequency of 13.56 MHz is connected to the pedestal electrode 22 to create a negative self-bias on the wafer 24. The bias attracts the positively charged metal atoms across the sheath of the adjacent plasma, thereby coating the sides and bottoms of high aspect-ratio holes in the wafer, such as, inter-level vias.

In SIP sputtering, the magnetron is small and has a high magnetic strength and a high amount of DC power is applied to the target so that the plasma density rises to above $10^{10}$ $cm^{-3}$ near the target 16. In the presence of this plasma density, a large number of sputtered atoms are ionized into positively charged metal ions. The metal ion density is high enough that a large number of them are attracted back to the target to sputter yet further metal ions. As a result, the metal ions can at least partially replace the argon ions as the effective working species in the sputtering process. That is, the argon pressure can be reduced. The reduced pressure has the advantage of reducing scattering and deionization of the metal ions. For copper sputtering, under some conditions it is possible in a process called sustained self-sputtering (SSS) to completely eliminate the argon working gas once the plasma has been ignited. For aluminum or tungsten sputtering, SSS is not possible, but the argon pressure can be substantially reduced from the pressures used in conventional sputtering, for example, to less than 1 milliTorr.

In one embodiment of the invention, an auxiliary array 60 of permanent magnets 62 is positioned around the chamber sidewalls 14 and is generally positioned in the half of the processing space towards the wafer 24. In this embodiment, the auxiliary magnets 62 have the same first vertical magnetic polarity as the outer pole 42 of the nested magnetron 36 so as to draw down the unbalanced portion of the magnetic field from the outer pole 42. In the embodiment described in detail below, there are eight permanent magnets, but any number of four or more distributed around the central axis 38 would provide similarly good results. It is possible to place the auxiliary magnets 62 inside the chamber sidewalls 14 but preferably outside the thin sidewall shield to increase their effective strength in the processing region. However, placement outside the sidewalls 14 is preferred for overall processing results.

Figure 2:
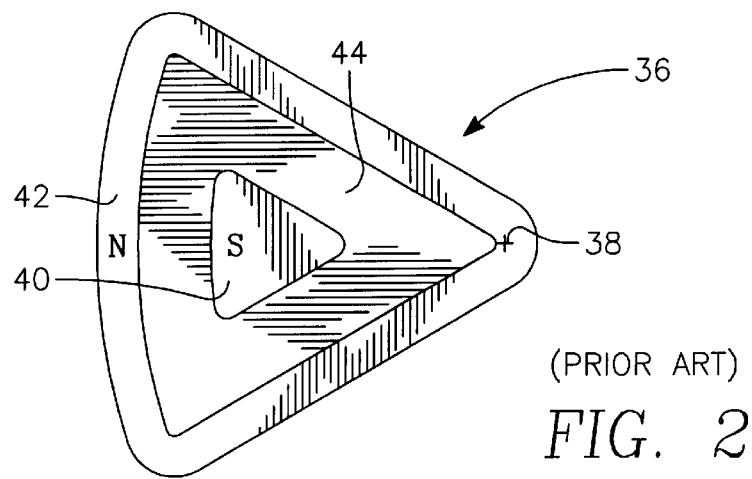
FIG. 2 is bottom plan view of the top magnetron in the sputter reactor of FIG. 1.

The auxiliary magnet array is generally symmetrically disposed about the central axis 38 to produce a circularly symmetric magnetic field. On the other hand, the nested magnetron 36 has a magnetic field distribution is asymmetrically disposed about the central axis 38 although, when it is averaged over the rotation time, it becomes symmetric. There are many forms of the nested magnetron 36. The simplest though less preferred form has a button center pole 40 surround by an circularly annular outer pole 42 such that its field is symmetric about an axis displaced from the chamber axis 38 and the nested magnetron axis is rotated about the chamber axis 38. The preferred nested magnetron has a triangular shape, illustrated in the bottom plan view of FIG. 2, with an apex near the central axis 38 and a base near the periphery of the target 16. This shape is particularly advantageous because the time average of the magnetic field is more uniform than for a circular nested magnetron.

The effective magnetic field at a particular instant of time during the rotation cycle is shown by the dotted lines of FIG. 1. A semi-toroidal field $B_M$ provides a strong horizontal component close to and parallel to the face of the target 16, thereby increasing the density of the plasma, the rate of sputtering, and the ionization fraction of sputtered particles. An auxiliary field $B_{A1}$, $B_{A2}$ is the sum of the field from the auxiliary magnet array 60 and from the unbalanced portion of the field of the nested magnetron 36. On the side of the chamber away from the nested magnetron 36, the component $B_{A1}$ from the unbalanced portion of the field of the nested magnetron 36 predominates, and it does not extend far towards the wafer 24. However, near the chamber sidewall 14 on the side of the nested magnetron 36, the auxiliary magnet 62 is strongly coupled to the outer magnet pole 42, resulting in a magnetic field component $B_{A2}$ that projects far towards the wafer 24. Out of the plane of the illustration, the magnetic field component is an combination of the two components $B_{A1}$, $B_{A1}$.

This structure effects the result that a strong vertical magnetic field is produced near to and along a substantial length of the chamber sidewall 14 in a region beneath the nested magnetron 36 sweeping about it because of the alignment of the magnetic polarities of the auxiliary magnets 42 and the strong outer magnetic poles 42. As a result, there is a strong vertical magnetic field on the exterior side of the chamber 12 adjacent the area of the target 16 being most strongly sputtered. This projecting field is effective for both extending the region of the plasma and for guiding the ionized particles to the wafer 24.

Figure 3:
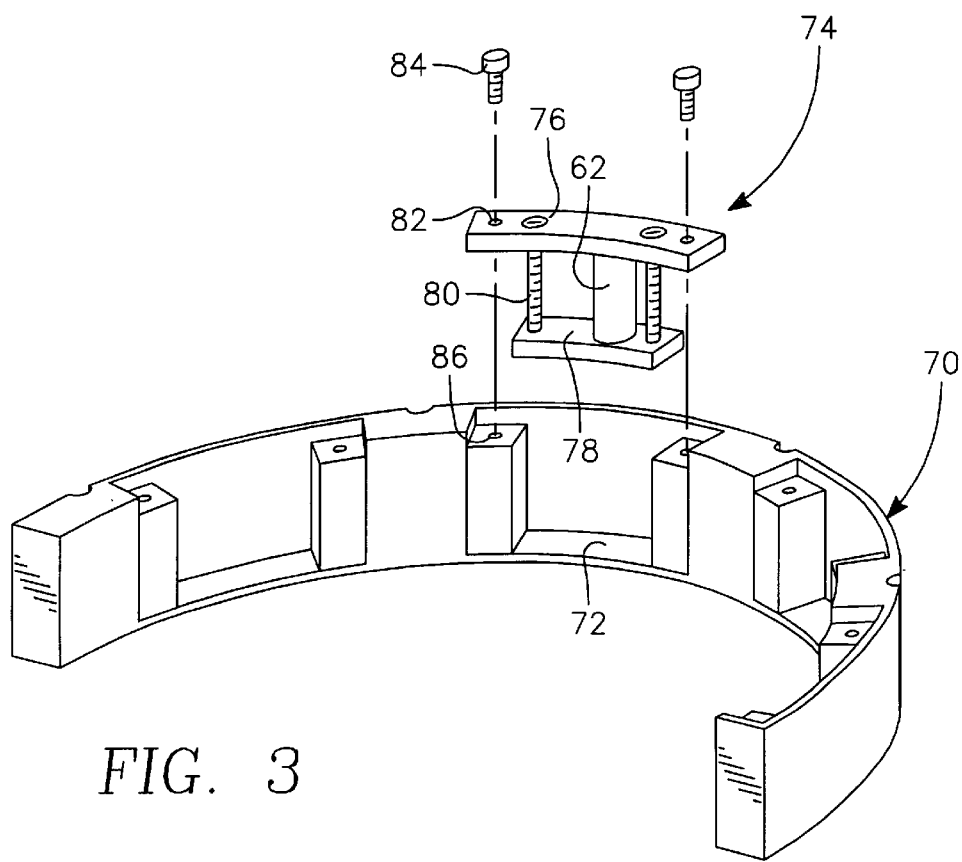
FIG. 3 is an orthographic view of an embodiment of an assembly supporting an auxiliary magnet array.

The auxiliary magnet array 60 may be implemented by the use of two semi-circular magnet carriers 70, one of which is illustrated orthographically in FIG. 3. Each carrier 70 includes four recesses 72 facing its interior and sized to receive a respective magnet assembly 74 including one magnet 62. The magnet assembly 74 includes an arc-shaped upper clamp member 76 and a lower clamp member 78, which capture the cylindrically shaped magnet 62 into recesses when two screws 80 tighten the two clamp members 76, 78 together. The carriers 70 and clamp members 76, 78 may be formed of non-magnetic material such as aluminum. The lower clamp member 78 has a length to fit into the recess 72 but the upper clamp member 76 has end portions extending beyond the recess 72 and through which are drilled two through holes 82. Two screws 84 pass through respective through holes to allow the screws 84 to be fixed in tapped holes 86 in the magnet carrier 70, thereby fixing the magnet 62 in position on the magnet carrier 70. Two so assembled semi-circular magnet carrier 70 are placed in a ring around the chamber wall 14 and fixed to it by conventional fastening means. This structure places the magnets 62 directly adjacent the exterior of the chamber wall 14.

Figure 4:
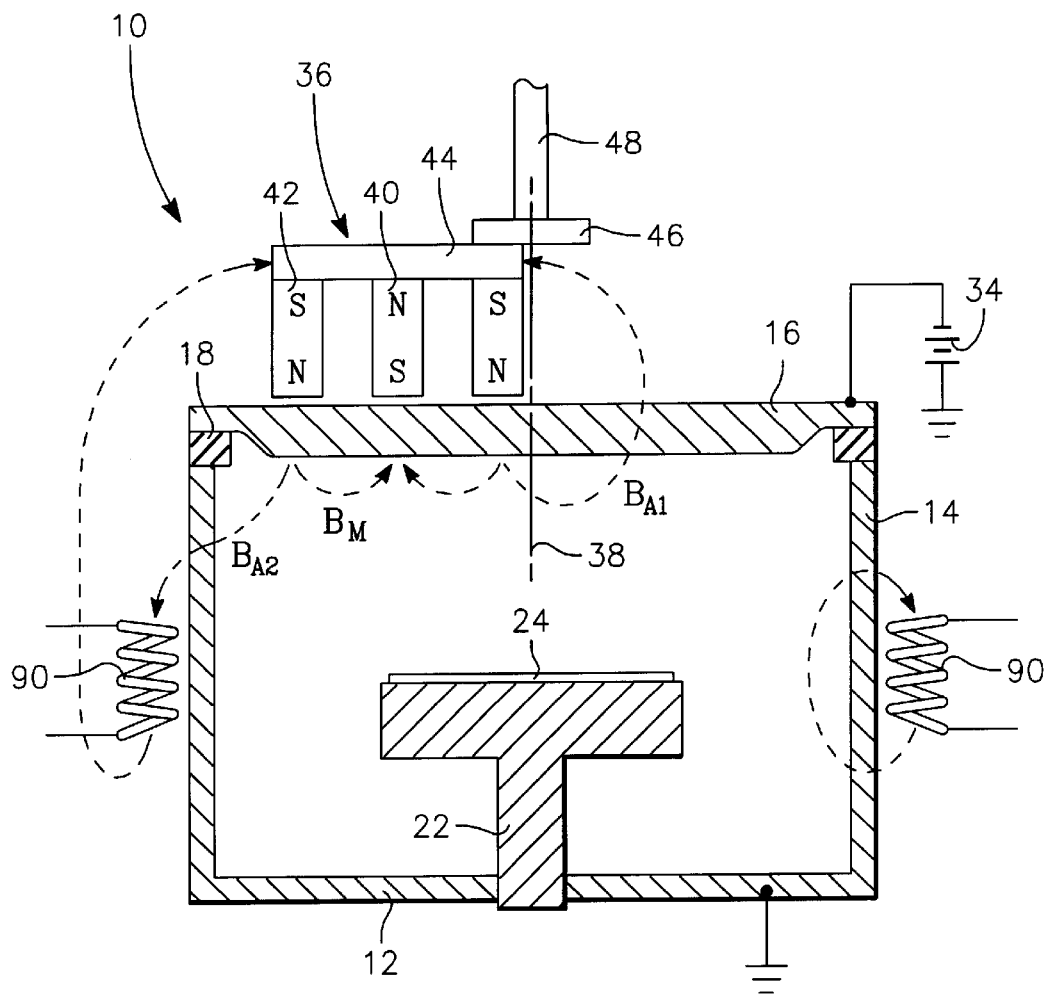
FIG. 4 is a schematic cross-sectional view of a sputter reactor in which the auxiliary magnet array includes an array of electromagnets.

The solenoidal magnetic field created inside the electromagnetic coil of Weir Wang is substantially more uniform across the diameter of the reactor chamber than is the peripheral dipole magnetic field created by an annular array of permanent magnets. However, it is possible to create a similarly shaped dipole field by replacing the permanent magnets 62 with, as illustrated in the cross-sectional view of FIG. 4, an annular array of electromagnetic coils 90 arranged around the periphery of the chamber wall. The coils 90 are typically wrapped as helices about respective axes parallel to the central axis 38 and are electrically powered to produce nearly identical magnetic dipole fields inside the chamber. Such a design has the advantage of allowing the quick adjustment of the auxiliary magnetic field strength and even the polarity of the field.

This invention has been applied to SIP sputtering of copper. While a conventional SIP reactor sputters a copper film having a non-uniformity of 9% determined by sheet resistance measurements, the auxiliary magnetron can be optimized to produce a non-uniformity of only 1%. Although the improved uniformity was purchased at the expense of reduced deposition rate, for the deposition of thin copper seed layers in deep holes, a lower deposition rate may be desirable for better process control.

Although the invention has been described for use in an SIP sputter reactor, the auxiliary permanent magnet array can be advantageously applied to other target and power configurations such as the annularly vaulted target of the SIP+ reactor of U.S. Pat. No. 6,251,242, the hollow cathode target of U.S. Pat. No. 6,179,973, or the inductively coupled IMP reactor of U.S. Pat. No. 6,045,547. Other magnetron configurations may be used, such as balanced magnetrons and stationery ones. Further, the polarity of the auxiliary magnets may be parallel or anti-parallel to the magnetic polarity of the outer pole of the top magnetron. Other materials may be sputtered including Al, Ta, Ti, Co, W etc. and the nitrides of several of these which are refractory metals.

The auxiliary magnet array thus provides additional control of the magnetic field crucial in magnetron sputtering.

What is claimed is:

1. A plasma sputter reactor, comprising:
   a vacuum chamber with sidewalls arranged around and substantially parallel to a central axis;
   a pedestal for supporting a substrate in said vacuum chamber;
   a sputtering target positioned in opposition to said pedestal along said central axis, a processing space being defined in a region between said pedestal, said target, and said sidewalls;
   a magnetron positioned on a side of said target opposite said processing space; and
   auxiliary magnets disposed at least partially around said processing space adjacent to said sidewalls and having a first magnetic polarity extending parallel to said central axis.

2. The plasma sputter reactor of claim 1, wherein said magnetron is rotatable about said central axis.

3. The plasma sputter reactor of claim 2, wherein said magnetron includes an inner pole having a second magnetic polarity extending parallel to said central axis and an outer pole surrounding said inner pole and having a third magnetic polarity extending parallel to said central axis opposite said first magnetic polarity.

4. The reactor of claim 3, wherein said inner pole encloses an area not including said central axis.

5. The reactor of claim 3, wherein said first polarity and said third magnetic polarity extend in parallel along a direction of said central axis.

6. The reactor of claim 1, wherein said auxiliary magnets comprise electromagnets.

7. The reactor of claim 1, wherein said auxiliary magnets comprise permanent magnets.

8. The reactor of claim 1, wherein said auxiliary magnets do not extend in planes passing perpendicularly to said central axis through a half of said processing space toward said target.

9. A plasma sputter reactor, comprising:
   a vacuum chamber with sidewalls arranged around a central axis;
   a pedestal for supporting a substrate in said vacuum chamber;
   a sputtering target positioned in opposition to said pedestal along said central axis, a processing space being defined in a region between said pedestal, said target, and said sidewalls;
   a magnetron positioned on a side of said target opposite said processing space; and
   auxiliary magnets disposed at least partially around said processing space having a first magnetic polarity along said central axis,
   wherein said magnetron includes an inner pole having a second magnetic polarity along said central axis and an outer pole surrounding said inner pole and having a third magnetic polarity along said central axis opposite said first magnetic polarity, and
   wherein said outer pole has a integrated magnetic flux of at least 150% that of said inner pole.

10. A plasma sputter reactor, comprising:
    a vacuum chamber with sidewalls arranged around a central axis;
    a pedestal for supporting a substrate in said vacuum chamber;
    a sputtering target positioned in opposition to said pedestal along said central axis, a processing space being defined in a region between said pedestal, said target, and said sidewalls;
    a magnetron positioned on a side of said target opposite said processing space; and
    auxiliary magnets disposed at least partially around said processing space having a first magnetic polarity along said central axis, wherein said first polarity is aligned with said third magnetic polarity, wherein said outer pole has a integrated magnetic intensity of at least 150% that of said inner pole.

11. A magnetron sputter reactor, comprising:
    a vacuum chamber with sidewalls arranged around a central axis;
    a pedestal for supporting in said vacuum chamber a substrate to be sputter coated;
    a sputtering target positioned in opposition to said pedestal along said central axis and being separated therefrom by a separation distance;
    a magnetron positioned on a side of said target opposite said pedestal and rotatable about said central axis, said magnetron comprising
       an annularly shaped outer pole having a first magnetic polarity along said central axis and producing a first integrated magnetic flux, and
       an inner pole disposed within said outer pole having a second magnetic polarity opposite said first magnetic polarity and producing a second integrated total magnetic flux,
       a ratio of said first integrated magnetic flux to said second integrated magnetic flux being at least 150%; and
    auxiliary magnets disposed around said central axis outside of said sidewalls and having said first magnetic polarity.

12. The reactor of claim 11, wherein said auxiliary magnets do not extend in planes perpendicular to said central axis and closer to said target than to said pedestal.

13. The reactor of claim 11, wherein said auxiliary magnets are permanent magnets.

14. The reactor of claim 11, wherein said auxiliary magnets are electromagnets.

15. The reactor of claim 11, wherein there are at least four of said auxiliary magnets.

* * * * *